(12) United States Patent
Yang

(10) Patent No.: US 12,394,475 B2
(45) Date of Patent: Aug. 19, 2025

(54) MEMORY DEVICE AND METHOD FOR ADJUSTING LOGIC STATES OF DATA STROBE SIGNALS USED BY MEMORY DEVICE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 199 days.

(21) Appl. No.: 18/382,659

(22) Filed: Oct. 23, 2023

(65) Prior Publication Data

US 2025/0131956 A1    Apr. 24, 2025

(51) Int. Cl.
  *G11C 11/4096*    (2006.01)
(52) U.S. Cl.
  CPC ................ *G11C 11/4096* (2013.01)
(58) Field of Classification Search
  CPC .................................................. G11C 11/4096
  USPC .................................................... 365/189.16
  See application file for complete search history.

(56) References Cited

U.S. PATENT DOCUMENTS

| | | | |
|---|---|---|---|
| 6,212,109 B1 * | 4/2001 | Proebsting .......... | G11C 11/4091 257/E21.659 |
| 6,356,485 B1 * | 3/2002 | Proebsting .......... | G11C 11/4076 257/E21.659 |
| 2002/0001234 A1 * | 1/2002 | Merritt ................. | G11C 7/1021 365/189.05 |
| 2006/0221712 A1 * | 10/2006 | Lowrey ................. | G11C 7/14 365/210.13 |
| 2017/0345474 A1 | 11/2017 | Kim et al. | |
| 2021/0124699 A1 | 4/2021 | Shimizu | |
| 2022/0059155 A1 | 2/2022 | Choi et al. | |
| 2022/0093157 A1 | 3/2022 | Park | |

FOREIGN PATENT DOCUMENTS

| | | |
|---|---|---|
| CN | 105930290 A | 9/2016 |
| CN | 114968904 A | 8/2022 |
| TW | 425546 B | 3/2001 |
| TW | 452795 B | 9/2001 |
| TW | 201933348 A | 8/2019 |

OTHER PUBLICATIONS

Office Action and and the search report mailed on Sep. 23, 2024 related to Taiwanese Application No. 112151158.
Office Action and and the search report mailed on Sep. 27, 2024 related to Taiwanese Application No. 113117338.

* cited by examiner

*Primary Examiner* — Ly D Pham
(74) *Attorney, Agent, or Firm* — Xuan Zhang

(57) ABSTRACT

A memory device is provided, which includes a memory cell array, a control circuit, and an interface circuit. The interface circuit includes a receiver circuit configured to amplify a first data strobe signal and a second data strobe signal received from a memory controller to generate a third data strobe signal and a fourth data strobe signal. In response to a first logic state of the first data strobe signal and a second logic state the second data strobe signal satisfying a predetermined condition, the receiver circuit adjusts a third logic state of the third data strobe signal and/or a fourth logic state of the fourth data strobe signal. The control circuit performs a write operation on the memory cell array according to the write command, the third data strobe signal, and the fourth data strobe signal.

20 Claims, 12 Drawing Sheets

MEMORY DEVICE AND METHOD FOR ADJUSTING LOGIC STATES OF DATA STROBE SIGNALS USED BY MEMORY DEVICE

TECHNICAL FIELD

The present disclosure relates to electronic circuits, and more particularly, to a memory device and a method for adjusting logic states of data strobe signals used by a memory device.

DISCUSSION OF THE BACKGROUND

An LPDDR4 (Low-power Double Data Rate 4) memory is the mobile equivalent of a DDR4 (Double Data Rate 4) memory. A memory controller can control data access of an LPDDR4 memory via command control signals, data signals, and data strobe signals. However, while an LPDDR4 memory performs a write operation according to a write command and data strobe signals from the memory controller, the write operation may fail since the data strobe signals are not well controlled by the memory controller. Accordingly, there is a demand for a memory device and a method for adjusting logic states of data strobe signals used by a memory device to solve the aforementioned problem.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory device. The memory device includes a memory cell array, a control circuit, and an interface circuit. The control circuit is configured to control data access of the memory cell array. The interface circuit is configured to receive a write command, a first data strobe signal, and a second data strobe signal from a memory controller. The interface circuit includes a receiver circuit configured to amplify the first data strobe signal and the second data strobe signal to generate a third data strobe signal and a fourth data strobe signal. In response to a first logic state of the first data strobe signal and a second logic state the second data strobe signal satisfying a predetermined condition, the receiver circuit is further configured to adjust a third logic state of the third data strobe signal and/or a fourth logic state of the fourth data strobe signal. The control circuit is further configured to perform a write operation on the memory cell array according to the write command, the third data strobe signal, and the fourth data strobe signal.

Another aspect of the present disclosure provides a memory device. The memory device includes a memory cell array, a control circuit, and an interface circuit. The control circuit is configured to control data access of the memory cell array. The interface circuit is configured to receive a write command, a first data strobe signal, and a second data strobe signal from a memory controller. The interface circuit includes a receiver circuit configured to amplify the first data strobe signal and the second data strobe signal to generate a third data strobe signal and a fourth data strobe signal. In response to a first logic state of the first data strobe signal and a second logic state the second data strobe signal satisfying a predetermined condition, the receiver circuit is further configured to adjust a third logic state of the third data strobe signal via a first voltage pull-up path and a second voltage pull-up path of the receiver circuit, and to adjust a fourth logic state of the fourth data strobe signal via a first voltage pull-down path and a second voltage pull-down path of the receiver circuit. The control circuit is further configured to perform a write operation on the memory cell array according to the write command, the third data strobe signal, and the fourth data strobe signal.

Yet another aspect of the present disclosure provides a method for adjusting logic states of data strobe signals used by a memory device electrically connected to a memory controller. The memory device includes a receiver circuit, a control circuit, and a memory cell array. The method includes the following steps: utilizing the receiver circuit to amplify a first data strobe signal and a second data strobe signal from the memory controller to generate a third data strobe signal and a fourth data strobe signal, respectively; in response to a first logic state of the first data strobe signal and a second logic state of the second data strobe signal satisfying a predetermined condition, adjusting, by the receiver circuit, a third logic state of the third data strobe signal and/or a fourth logic state of the fourth data strobe signal; and performing a write operation, by the control circuit, to the memory cell array using the third data strobe signal and the fourth data strobe signal.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
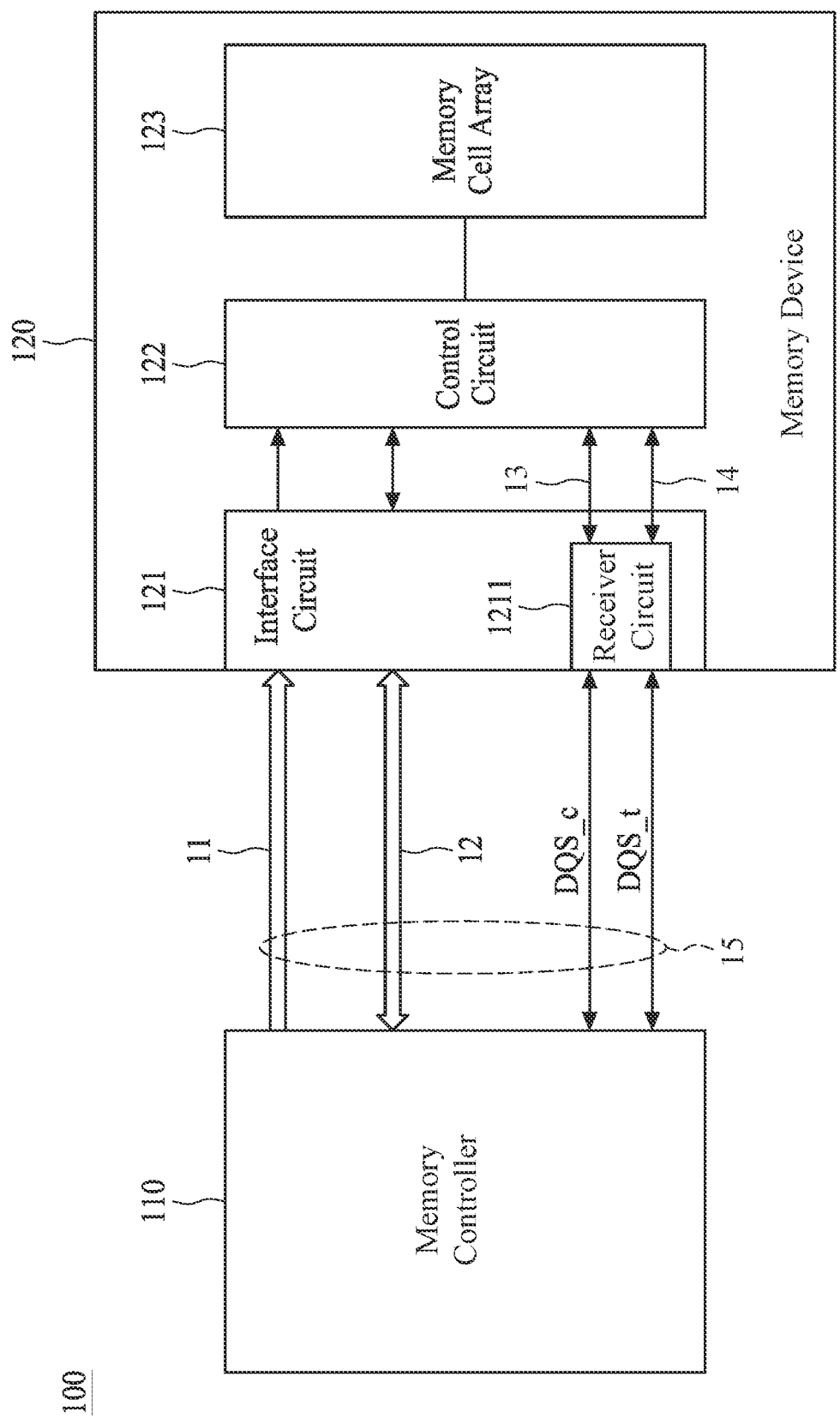
FIG. 1 is a block diagram of an electronic device 100 in accordance with an embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90° or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

FIG. 1 is a block diagram of an electronic device 100 in accordance with an embodiment of the present disclosure.

In some embodiments, the electronic device 100 may include a memory controller 110 and a memory device 120, as depicted in FIG. 1. The memory controller 110 may be implemented by a central processing unit (CPU), a microprocessor, a digital signal processor, a field-programmable gate arrays (FPGA), an application-specific integrated circuit (ASIC), or a radio-frequency integrated circuit (RFIC).

In some embodiments, the memory device 120 may be a dynamic random access memory (DRAM). In other embodiments, other types of memories can be used. For purposes of description, this disclosure may focus on double-date rate synchronous dynamic random access memory (DDR SDRAM) such as LPDDR4, but the scope of embodiments is not limited to any particular memory technology or standard.

In some embodiments, the memory device 120 may include an interface circuit 121, a control circuit 122, and a memory cell array 123. The interface circuit 121 may be configured to transmit and receive data signals 12 over bus 15, and to receive command control signals 11 and data strobe signals DQS_c and DQS_t from the memory controller 110 over bus 15. In other words, the interface circuit 121 may include TX circuits (not explicitly shown) for the data signals 12, and RX circuits (not explicitly shown) for the command control signals 11, data signals 12, and data strobe signals DQS_c and DQS_t.

In some embodiments, the data strobe signal DQS_c may be a complementary signal of the data strobe signal DQS_t. For example, when the data strobe signal DQS_t is in the high logic state (e.g., 1), the data strobe signal DQS_c is in the low logic state (e.g., 0). When the data strobe signal DQS_t is in the low logic state (e.g., 0), the data strobe signal DQS_c is in the high logic state (e.g., 1). In some embodiments, the logic states of the data strobe signals DQS_t and DQS_c may be the same if a write data strobe (WDQS) function of the memory controller 110 is not enabled or not properly implemented.

In some embodiments, the RX circuits for the data strobe signals DQS_c and DQS_t can be referred to as a receiver circuit 1211 shown in FIG. 1. The receiver circuit 1211 may be configured to correct the data strobe signals DQS_c and DQS_t with inappropriate logic states and/or timing to generate data strobe signals 13 and 14. The data strobe signals 13 and 14 may be data strobe signals (e.g., *DQS_c and *DQS_t) with corrected logic states complying with the LPDDR4 standard defined by JEDEC Solid State Technology Association (i.e., abbreviated as JEDEC).

In some embodiments, the control circuit 122 may perform a read operation or a write operation according to the command control signals 11 and the data strobe signals 13 and 14. For example, during a write operation, the memory device 120 may receive a write command (e.g., including command control signal 11 and data signals 12) from the memory controller 110 over bus 15, and the control circuit 122 may then store the received data in the memory cell array 123. During a read operation, the memory device 120 may receive a read command signal (e.g., command control signal 11) from the memory controller 110 over bus 15, and the control circuit 122 may then access the data from various memory cells of the memory cell array 123, and transmit those bits of data (e.g., data signals 12) to the memory controller 110 over bus 15.

Figure 2:
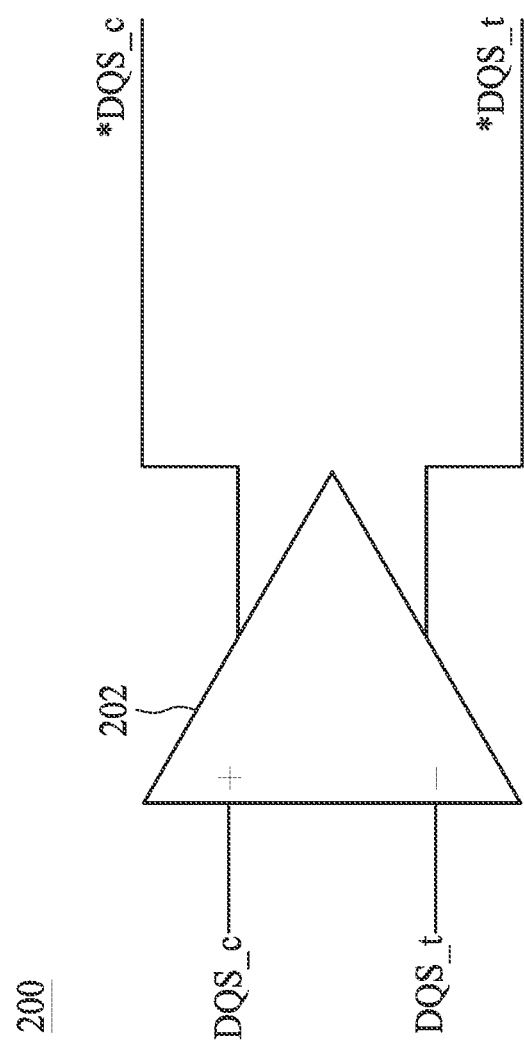
FIG. 2 is a schematic diagram of a receiver circuit 200 in accordance with an embodiment of the present disclosure.

FIG. 2 is a schematic diagram of a receiver circuit 200 in accordance with an embodiment of the present disclosure. FIGS. 3A-3E are waveform diagrams of the data strobe signals during a write operation in accordance with an embodiment of the present disclosure. Please refer to FIG. 1, FIG. 2, and FIGS. 3A-3E.

In some embodiments, the receiver circuit 1211 shown in FIG. 1 can be implemented using the receiver circuit 200 shown in FIG. 2. The receiver circuit 200 may include a differential amplifier 202 configured to amplify the data strobe signals DQS_c and DQS_t to generate the data strobe signal *DQS_c and *DQS_t. For example, the receiver circuit 200 may respectively receive the data strobe signals DQS_c and DQS_t at its positive input terminal (e.g., +) and a negative input terminal (e.g., −) to generate the data strobe signal *DQS_c and *DQS_t. In some embodiments, the amplitude of the data strobe signals DQS_c and DQS_t may be between 50 mv and 100 mv which may not have a sufficient voltage level (e.g., 0.6V or 1.1V for an LPDDR4 DRAM) for the control circuit 122 to perform a write operation or a read operation. The amplitude of the data strobe signal *DQS_c and *DQS_t may be approximately 0.6V or 1.1V, and the control circuit 122 can perform a write operation or a read operation according to the command control signals 11 and the data strobe signal *DQS_c and *DQS_t.

In some embodiments, given that the memory device 120 is an LPDDR4 DRAM and the memory controller 110 follows the LPDDR4 standard (e.g., the write data strobe (WDQS) function is turned on), when the memory controller 110 issues a write command to the memory device 120, the data strobe signals DQS_t and DQS_c should be respectively kept at the low logic state and the high logic state prior to a write preamble being issued to the memory device 120 by the memory controller 110 at time t0. The duration tWPRE of the write preamble may last two clock cycles (e.g., from time to t0 time t4) till the data (e.g., data signals 12) being received by the control circuit 122 at time t4, and the data strobe signals DQS_t and DQS_c may vary in the duration tWPRE of the write preamble, as shown in FIG. 3A.

However, in some cases, the WDQS function of the memory controller 110 may not be turned on or properly implemented, resulting in uncertain logic states of the data strobe signals DQS_t and DQS_c for a duration (e.g., the time interval from time t(n−4) to time t0) prior to the write preamble being received by the control circuit 122 at time t0.

Figure 3A:
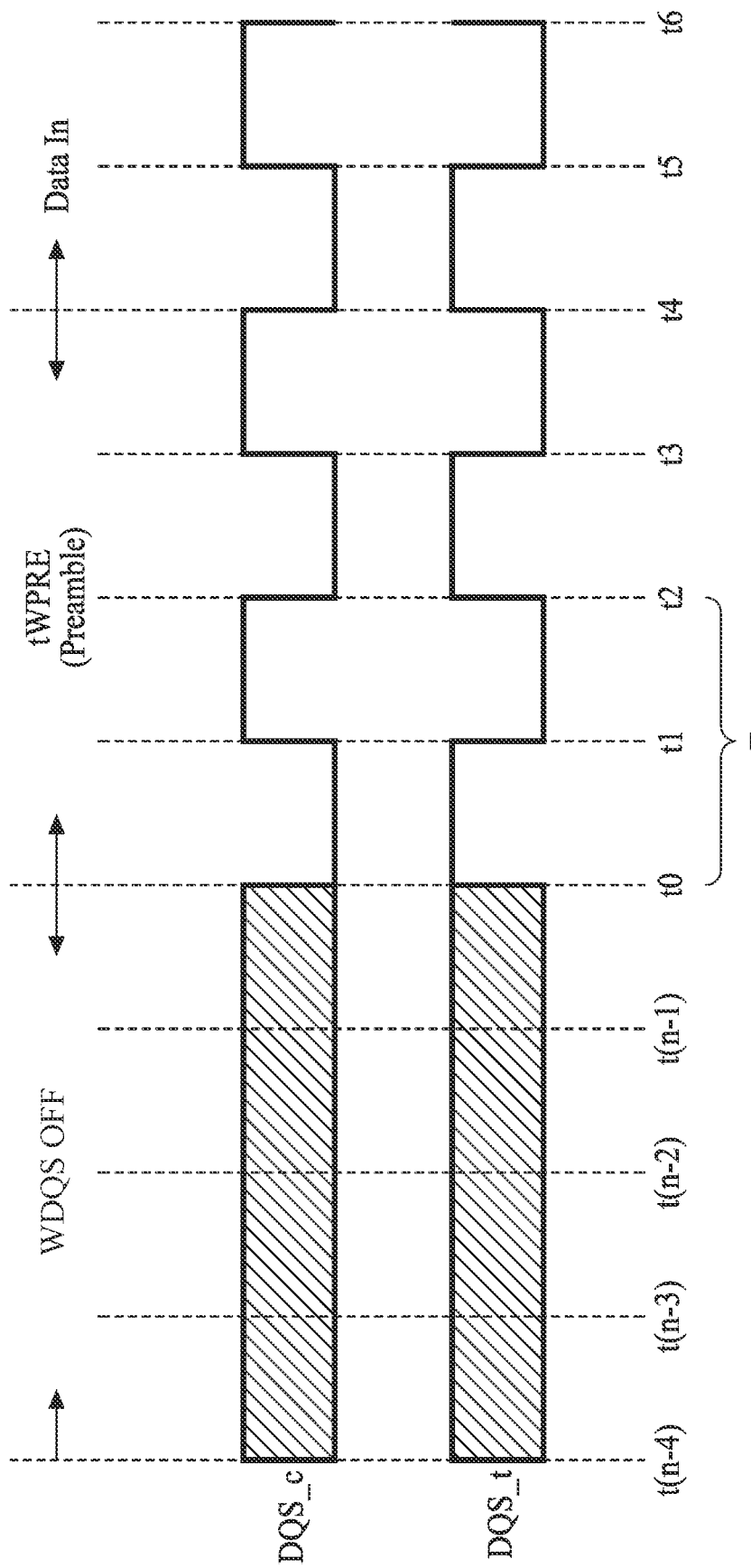
FIGS. 3A-3E are waveform diagrams of the data strobe signals during a write operation in accordance with an embodiment of the present disclosure.

For example, as depicted in FIG. 3A, the time interval between every two adjacent time points from t(n−4) to t6 may be half a clock cycle T/2. In other words, two time intervals (e.g., from t0 to t2) may constitute a clock cycle T.

At time t0, the write preamble tWPRE is issued by the memory controller 110. If the WDQS function is turned off, the logic states of the data strobe signals DQS_t and DQS_c may be uncertain for a duration (e.g., from time t(n−4) to time t0) prior to the write preamble tWPRE being issued at time t0, as shown in FIG. 3A. This situation can cause failure of the control circuit 122 during a write operation.

Figure 3B:
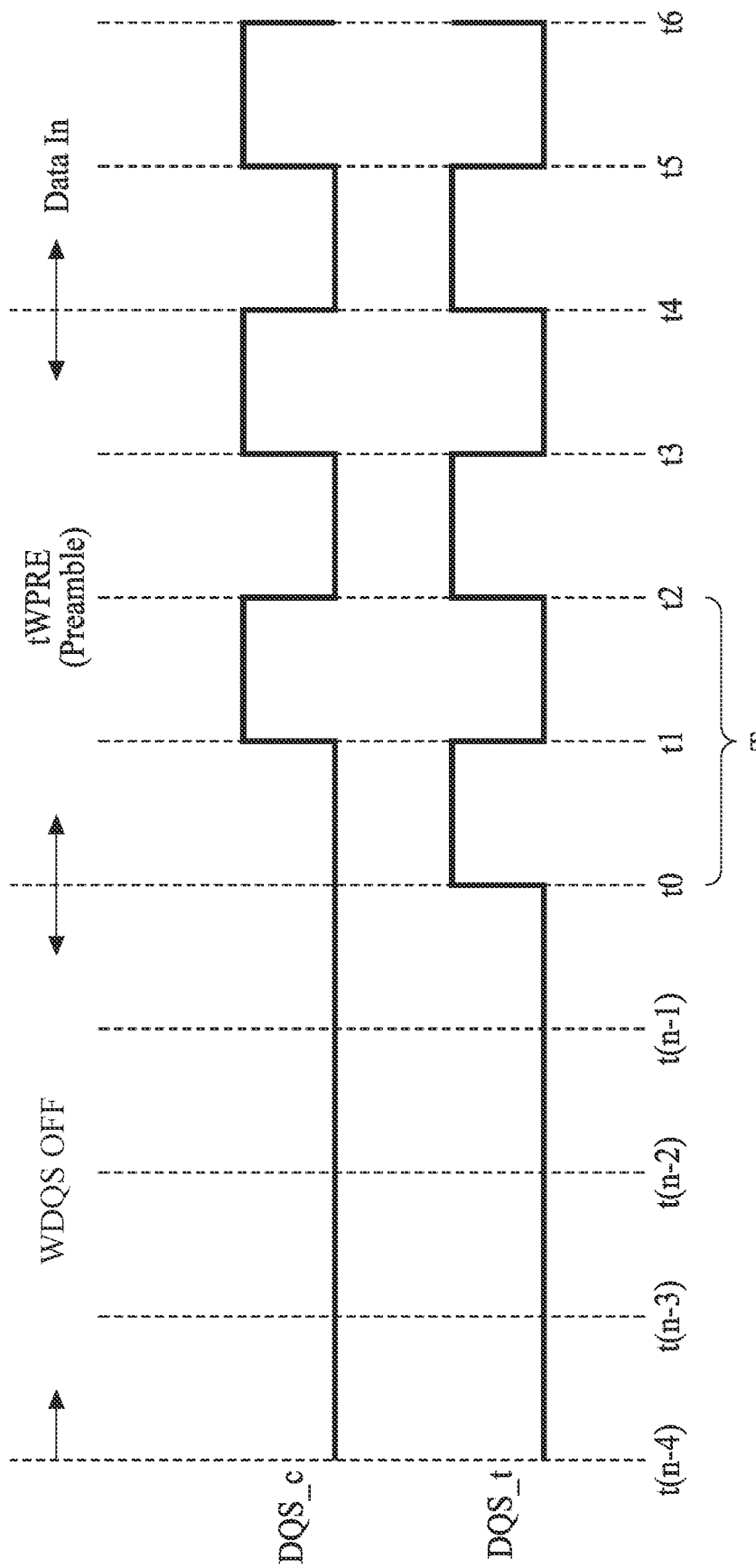

More specifically, there are four conditions of the logic states of the data strobe signals DQS_t and DQS_c for a duration prior to time t0. In the first condition, the WDQS function of the memory controller 110 may be not enabled, and the data strobe signals DQS_t and DQS_c kept at the low logic state for a duration prior to the write preamble being received by the control circuit 122 at time t0, as shown in FIG. 3B. The first condition can cause failure of the control circuit 122 during a write operation since the first condition does not comply with the requirement of a write operation of the LPDDR4 standard defined by the JEDEC.

Figure 3C:
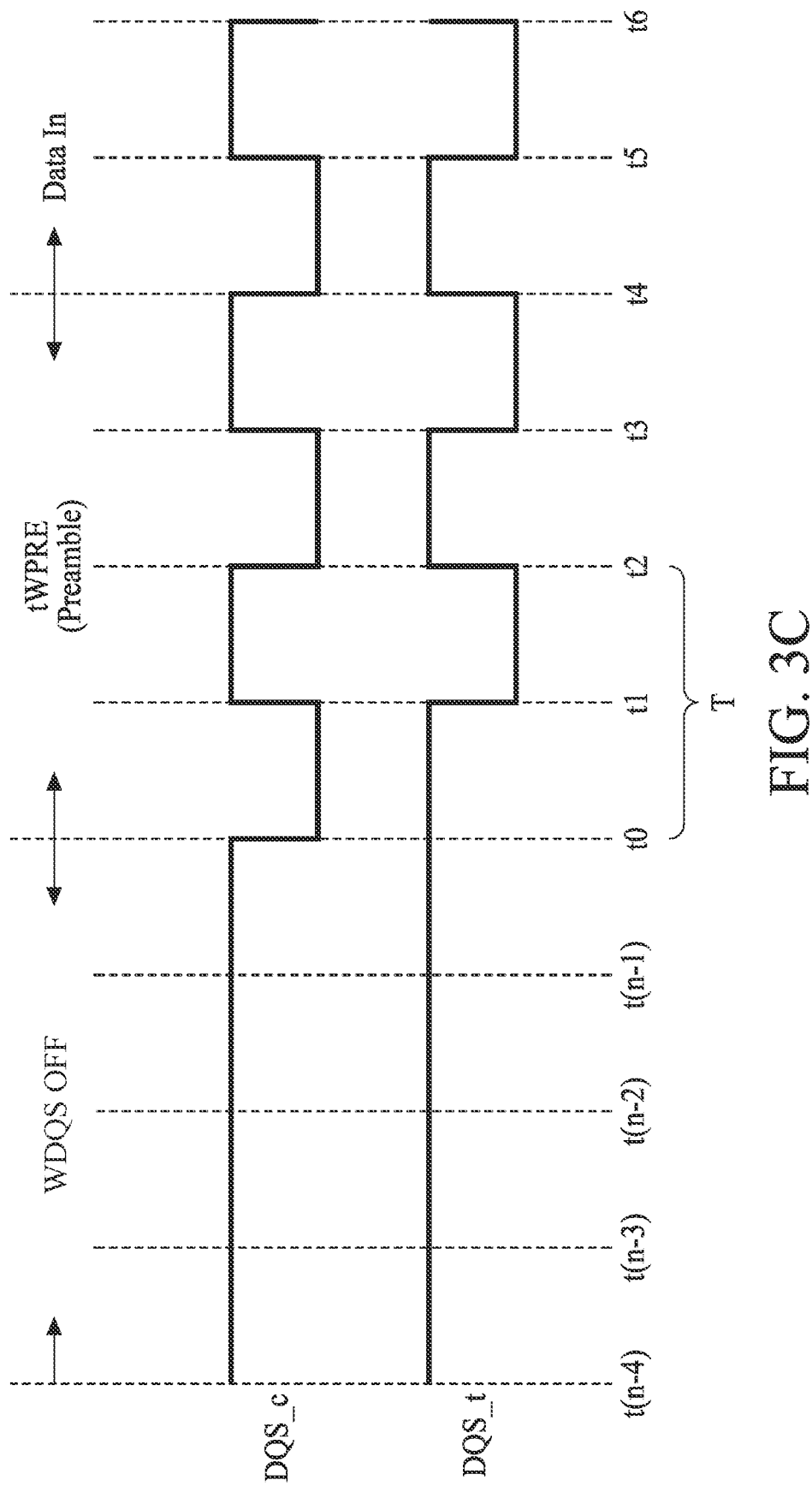

In the second condition, the WDQS function of the memory controller 110 may be not enabled, and the data strobe signals DQS_t and DQS_c kept at the high logic state for a duration prior to the write preamble being received by the control circuit 122 at time to, as shown in FIG. 3C. The second condition can cause failure of the control circuit 122 during a write operation since the second condition does not comply with the requirement of a write operation of the LPDDR4 standard defined by the JEDEC.

Figure 3D:
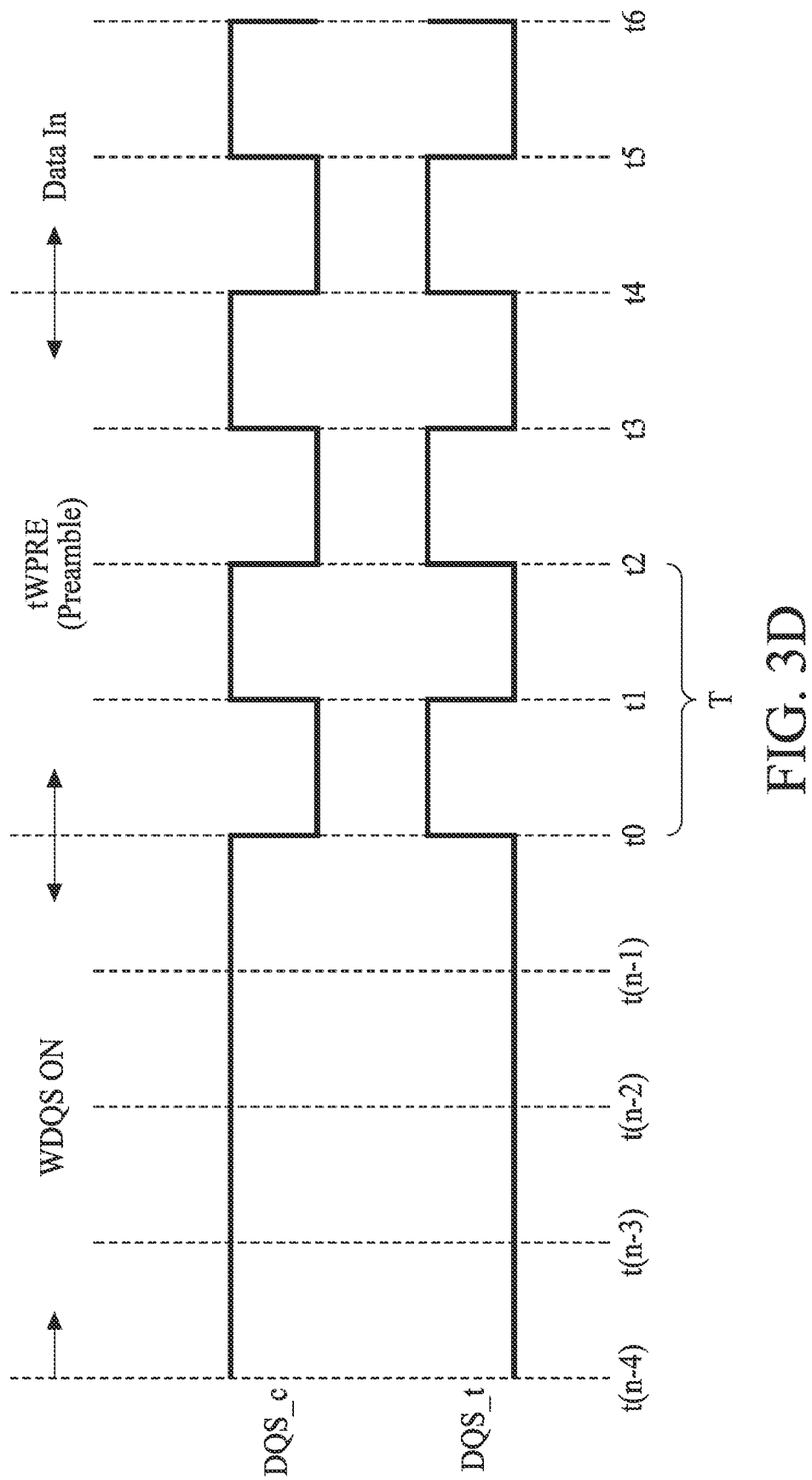

In the third condition, the WDQS function of the memory controller 110 may be enabled, and the data strobe signals DQS_t and DQS_c respectively kept at the low logic state and the high logic state for a duration prior to the write preamble being received by the control circuit 122 at time t0, as shown in FIG. 3D. The third condition will not cause failure of the control circuit 122 during a write operation since the third condition complies with the requirement of a write operation of the LPDDR4 standard defined by the JEDEC.

Figure 3E:
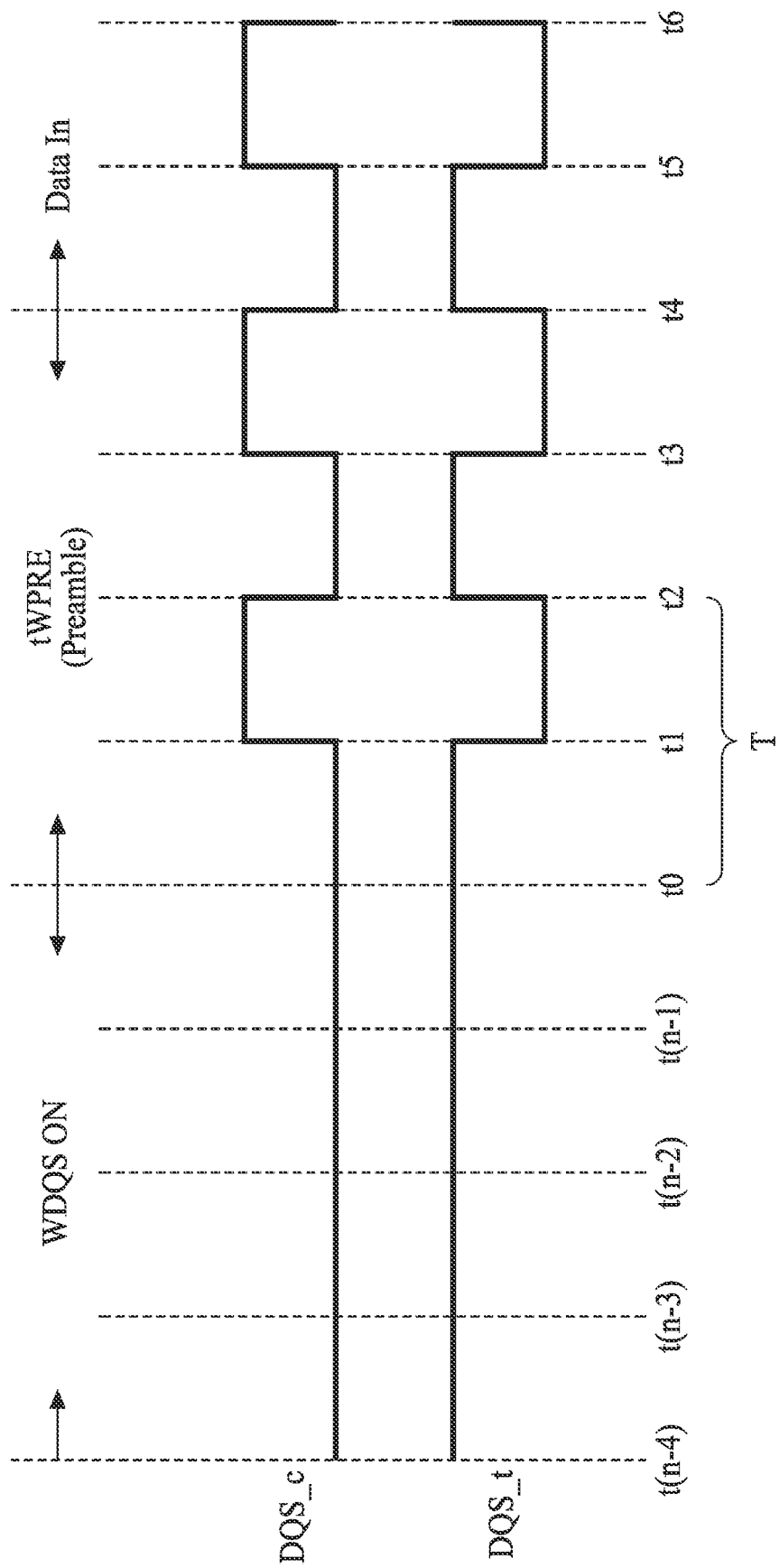

In the fourth condition, the WDQS function of the memory controller 110 may be enabled, and the data strobe signals DQS_t and DQS_c respectively kept at the high logic state and the low logic state for a duration prior to the write preamble being received by the control circuit 122 at time t0, as shown in FIG. 3E. The fourth condition will also not cause failure of the control circuit 122 during a write operation since the fourth condition complies with the LPDDR4 standard defined by the JEDEC.

Figure 4:
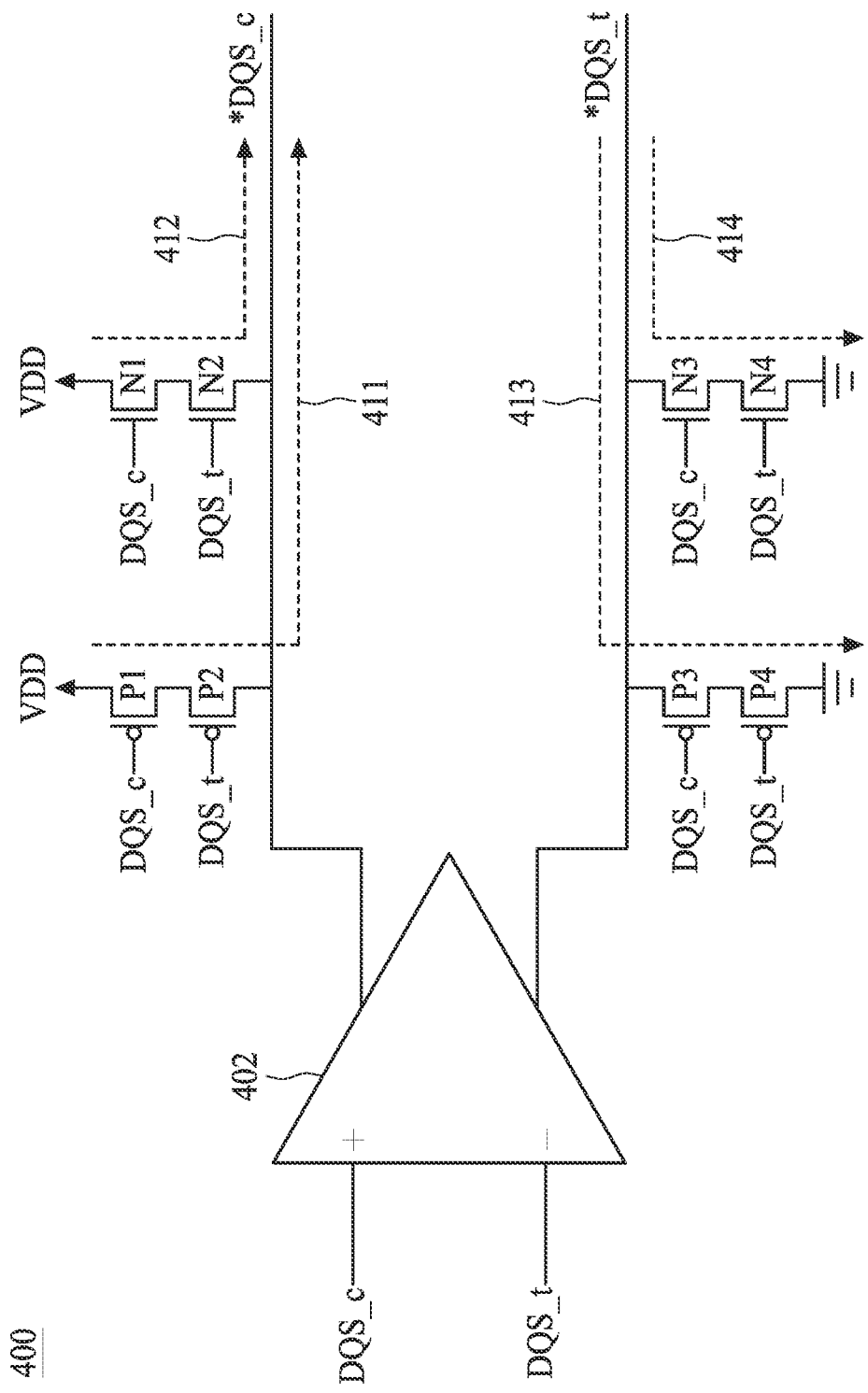
FIG. 4 is a diagram of a receiver circuit 400 in accordance with another embodiment of the present disclosure.
Figure 5A:
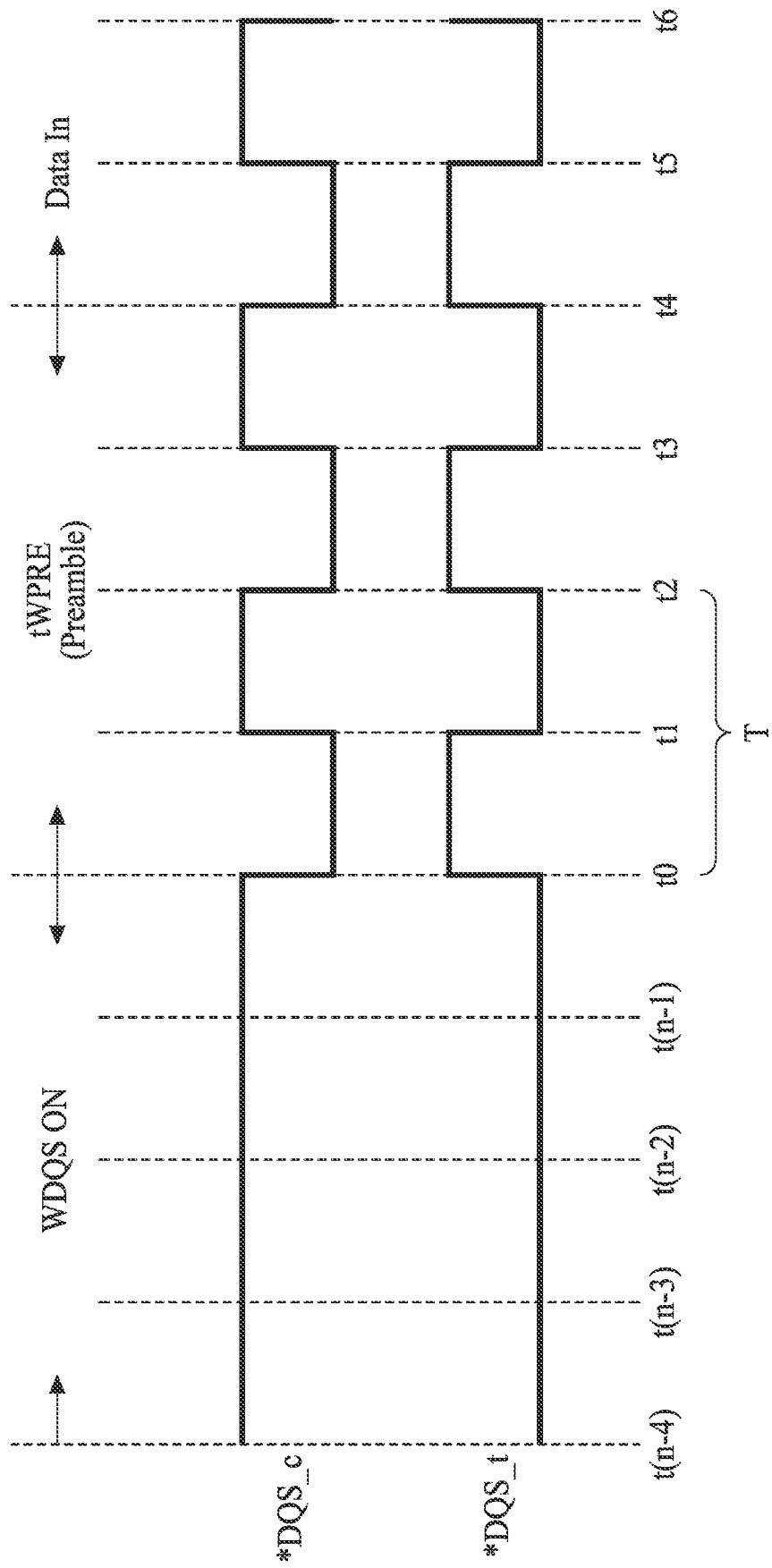
FIGS. 5A-5B are waveform diagrams of the data strobe signals *DQS_t and *DQS_c generated by the receiver circuit 400 of FIG. 4.
Figure 5B:
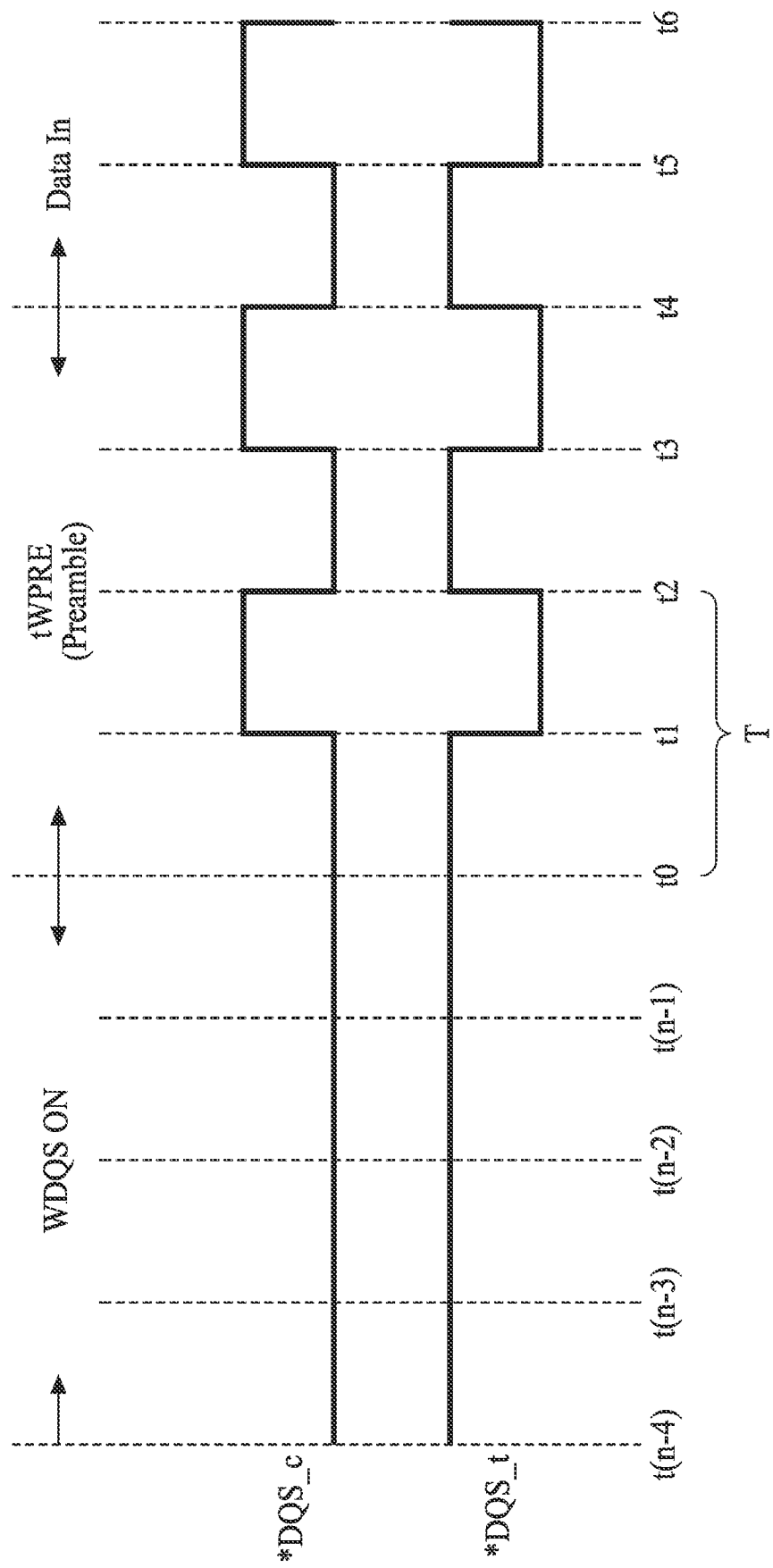

FIG. 4 is a diagram of a receiver circuit 400 in accordance with another embodiment of the present disclosure. FIGS. 5A-5B are waveform diagrams of the data strobe signals *DQS_t and *DQS_c generated by the receiver circuit 400 of FIG. 4. Please refer to FIG. 1, FIG. 4, and FIGS. 5A-5D.

In some embodiments, the receiver circuit 1211 shown in FIG. 1 can be implemented using the receiver circuit 400 shown in FIG. 4. The receiver circuit 400 may include a differential amplifier 402 and transistors P1-P4 and N1-N4. The differential amplifier 402 may be configured to amplify the data strobe signals DQS_c and DQS_t (e.g., input data strobe signals) to generate the data strobe signal *DQS_c and *DQS_t (e.g., output data strobe signals). The data strobe signals *DQS_c and *DQS_t can be referred to as the data strobe signals 13 and 14 in FIG. 1, respectively.

In some embodiments, the logic state of the data strobe signal *DQS_c may be controlled by voltage pull-up paths 411 and 412. In addition, the logic state of the data strobe signal *DQS_t may be controlled by voltage pull-down paths 413 and 414, as depicted in FIG. 4. In some embodiments, transistors P1 and P2 can be regarded as pull-up transistors, and may form the voltage pull-up path 411. Transistors N1 and N2 can be regarded as pull-up transistors, and may form the voltage pull-up path 412. Transistors P3 and P4 can be regarded as pull-down transistors, and may form the voltage pull-down path 413. Transistors N3 and N4 can be regarded as pull-down transistors, and may form the voltage pull-down path 414.

More specifically, the logic states of the data strobe signals *DQS_c and *DQS_t will follow those of the data strobe signal DQS_c and DQS_t without the voltage pull-up paths 411-412 and voltage pull-down paths 413-414, the details of which are provided in the embodiment of FIG. 2. In some embodiments, when the WDQS function of the memory controller 110 is not enabled or improperly implemented, prior to the write preamble being received by the control circuit 122, the voltage pull-up paths 411 and 412 may be used to correct inappropriate logic state of the data strobe signal *DQS_c, and the voltage pull-down paths 413 and 414 may be used to correct inappropriate logic state of the data strobe signal *DQS_t.

In some embodiments, the operation of the receiver circuit 400 may differ when the logic states of the data strobe signals DQS_c and DQS_t are in different conditions. For example, four conditions represent different combinations of the logic states of the data strobe signals DQS_c and DQS_t. In the first condition, both the data strobe signals DQS_c and DQS_t are in the low logic state (i.e., DQS_c=DQS_t=0). In the second condition, both the data strobe signals DQS_c and DQS_t are in the high logic state (i.e., DQS_c=DQS_t=1). In the third condition, the data strobe signal DQS_c is in the low logic state, and the data strobe DQS_t is in the high logic state (i.e., DQS_c=0 and DQS_t=1). In the fourth condition, the data strobe signal DQS_c is in the high logic state, and the data strobe DQS_t is in the low logic state (i.e., DQS_c=1 and DQS_t=0).

In some embodiments, when the logic states of the data strobe signals DQS_c and DQS_t satisfy the first condition for a duration (i.e., DQS_c=DQS_t=0 from time t(n−4) to time t0, as shown in FIG. 3B) prior to the write preamble being received by the control circuit 122, transistors P1 to P4 are turned on, and transistors N1 to N4 are turned off. At this time, the voltage pull-up path 411 is enabled, and the voltage pull-up path 412 is disabled. In addition, the voltage pull-down path 413 is enabled, and the voltage pull-down path 414 is disabled. Thus, the voltage level of the data strobe signal *DQS_c will be pulled up to the power supply voltage VDD through the voltage pull-up path 411, and thus the data strobe signal *DQS_c will be in the high logic state (i.e., *DQS_c=1). In addition, the voltage level of data strobe signal *DQS_t will be pulled down to the ground (e.g., 0V) through the voltage pull-down path 413, and thus the data strobe signal *DQS_t will be in the low logic state.

Specifically, since the logic states of the data strobe signals DQS_c and DQS_t (e.g., DQS_c=DQS_t=0) fail to comply with the requirement of logic states (e.g., DQS_c=1 and DQS_t=0) for a duration prior to the write preamble being received by the control circuit 122 as defined by the LPDDR4 standard, the logic states of the data strobe signals *DQS_c and *DQS_t output by the receiver circuit 400 may be corrected (i.e., *DQS_c=1 and *DQS_t=0) to comply with the requirement for logic states of the data strobe signals as defined by the LPDDR4 standard. Therefore, when the logic states of the data strobe signals DQS_c and DQS_t satisfy a first condition (e.g., DQS_c=DQS_t=0), the WDQS function can be forced on by the receiver circuit 400 so that the corrected logic states of the data strobed signals *DQS_c and *DQS_t comply with the requirement for logic states of the data strobe signals as defined by the LPDDR4 standard.

The waveforms of the data strobe signals *DQS_c and *DQS_t with corrected logic states are shown in FIG. 5A. For example, the logic states of the data strobe signals *DQS_c and *DQS_t output by the receiver circuit 400 may be respectively in the high logic state and low logic state for a duration (e.g., *DQS_c=1 and *DQS_t=0 from time t(n−4) to time t0) prior to the write preamble being received by the control circuit 122 at time t0. From time t0, the data strobe signals *DQS_c and *DQS_t may be respectively in the low logic state and the high logic state, and the logic states of the data strobe signals *DQS_c and *DQS_t may toggle from 0 to 1 or from 1 to 0 every half clock cycle (i.e., T/2). After a 2-clock-cycle duration of the write preamble (e.g., from time t0 time t4), the data strobe signals *DQS_c and *DQS_t may be respectively in the low logic state and the high logic state at time t4, and the logic states of the data strobe signals *DQS_c and *DQS_t may toggle from 0 to 1 or from 1 to 0 every half clock cycle (i.e., T/2) during the data input (i.e., Data In) phase, as depicted in FIG. 5A.

In some embodiments, when the logic states of the data strobe signals DQS_c and DQS_t satisfy the second condition for a duration (i.e., DQS_c=DQS_t=1 from time t(n−4) to time t0, as shown in FIG. 3C) prior to the write preamble being received by the control circuit 122, transistors P1 to P4 are turned off, and transistors N1 to N4 are turned on. At this time, the voltage pull-up path 411 is disabled, and the voltage pull-up path 412 is enabled. In addition, the voltage pull-down path 413 is disabled, and the voltage pull-down path 414 is enabled. Thus, the voltage level of the data strobe signal *DQS_c will be pulled up to the power supply voltage VDD through the voltage pull-up path 412, and thus the data strobe signal *DQS_c will be in the high logic state (i.e., *DQS_c=1). In addition, the voltage level of data strobe signal *DQS_t will be pulled down to the ground (e.g., 0V) through the voltage pull-down path 414, and thus the data strobe signal *DQS_t will be in the low logic state.

Specifically, since the logic states of the data strobe signals DQS_c and DQS_t (e.g., DQS_c=DQS_t=1) fail to comply with the requirement for logic states (e.g., DQS_c=1 and DQS_t=0) for a duration prior to the write preamble being received by the control circuit 122 as defined by the LPDDR4 standard, the logic states of the data strobe signals *DQS_c and *DQS_t output by the receiver circuit 400 may be corrected (i.e., *DQS_c=1 and *DQS_t=0) to comply with the requirement for logic states of the data strobe signals as defined by the LPDDR4 standard, and the waveforms of the data strobe signals *DQS_c and *DQS_t are shown in FIG. 5A.

In some embodiments, when the logic states of the data strobe signals DQS_c and DQS_t satisfy the third condition for a duration (i.e., DQS_c=1 and DQS_t=0 from time t(n−4) to time t0, as shown in FIG. 3D) prior to the write preamble being received by the control circuit 122, transistors P1, P3, N2, and N4 are turned off, and transistors P2, P4, N1, and N3 are turned on. At this time, the voltage pull-up paths 411 and 412 are disabled, as are the voltage pull-down paths 413 and 414. Thus, the receiver circuit 400 will not change the logic states of the data strobe signals *DQS_c and *DQS_t which follow the logic states of the data strobe signals DQS_c and DQS_t.

Specifically, since the logic states of the data strobe signals DQS_c and DQS_t (e.g., DQS_c=1 and DQS_t=0) comply with the requirement for logic states (e.g., DQS_c=1 and DQS_t=0) for two clock cycles prior to the write preamble being received by the control circuit 122 as defined by the LPDDR4 standard, the logic states of the data strobe signals *DQS_c and *DQS_t output by the receiver circuit 400 will follow the logic states of the data strobe signals DQS_c and DQS_t, and the waveforms of the data strobe signals *DQS_c and *DQS_t are shown in FIG. 5A.

In some embodiments, when the logic states of the data strobe signals DQS_c and DQS_t satisfy the fourth condition for two clock cycles (i.e., DQS_c=0 and DQS_t=1 from time t(n−4) to time t0, as shown in FIG. 3E) prior to the write preamble being received by the control circuit 122, transistors P1, P3, N2, and N4 are turned on, and transistors P2, P4, N1, and N3 are turned off. At this time, the voltage pull-up paths 411 and 412 are disabled, as are voltage pull-down paths 413 and 414. Thus, the receiver circuit 400 will not change the logic states of data strobe signals *DQS_c and *DQS_t which follow the logic states of the data strobe signals DQS_c and DQS_t.

Specifically, since the logic states of the data strobe signals DQS_c and DQS_t are complementary in the fourth condition, the control circuit 122 may be capable of performing a write operation according to the data strobe signals DQS_c and DQS_t. In addition, the logic states of the data strobe signals *DQS_c and *DQS_t output by the receiver circuit 400 will follow the logic states of the data strobe signals DQS_c and DQS_t.

The waveforms of the data strobe signals *DQS_c and *DQS_t with corrected logic states are shown in FIG. 5B. For example, the logic states of the data strobe signals *DQS_c and *DQS_t output by the receiver circuit 400 may be respectively in the high logic state and low logic state for two clock cycles (e.g., *DQS_c=1 and *DQS_t=0 from time t(n−4) to time t0) prior to the write preamble being received by the control circuit 122 at time t0. At time t0, the data strobe signals *DQS_c and *DQS_t may be respectively in the low logic state and the high logic state, and the logic states of the data strobe signals *DQS_c and *DQS_t may toggle from 0 to 1 or from 1 to 0 every half clock cycle (i.e., T/2). After a 2-clock-cycle duration of the write preamble (e.g., from time to t0 time t4), the data strobe signals *DQS_c and *DQS_t may be respectively in the low logic state and the high logic state at time t4, and the logic states of the data strobe signals *DQS_c and *DQS_t may toggle from 0 to 1 or from 1 to 0 every half clock cycle (i.e., T/2) during the data input (i.e., Data In) phase, as depicted in FIG. 5B.

Figure 6:
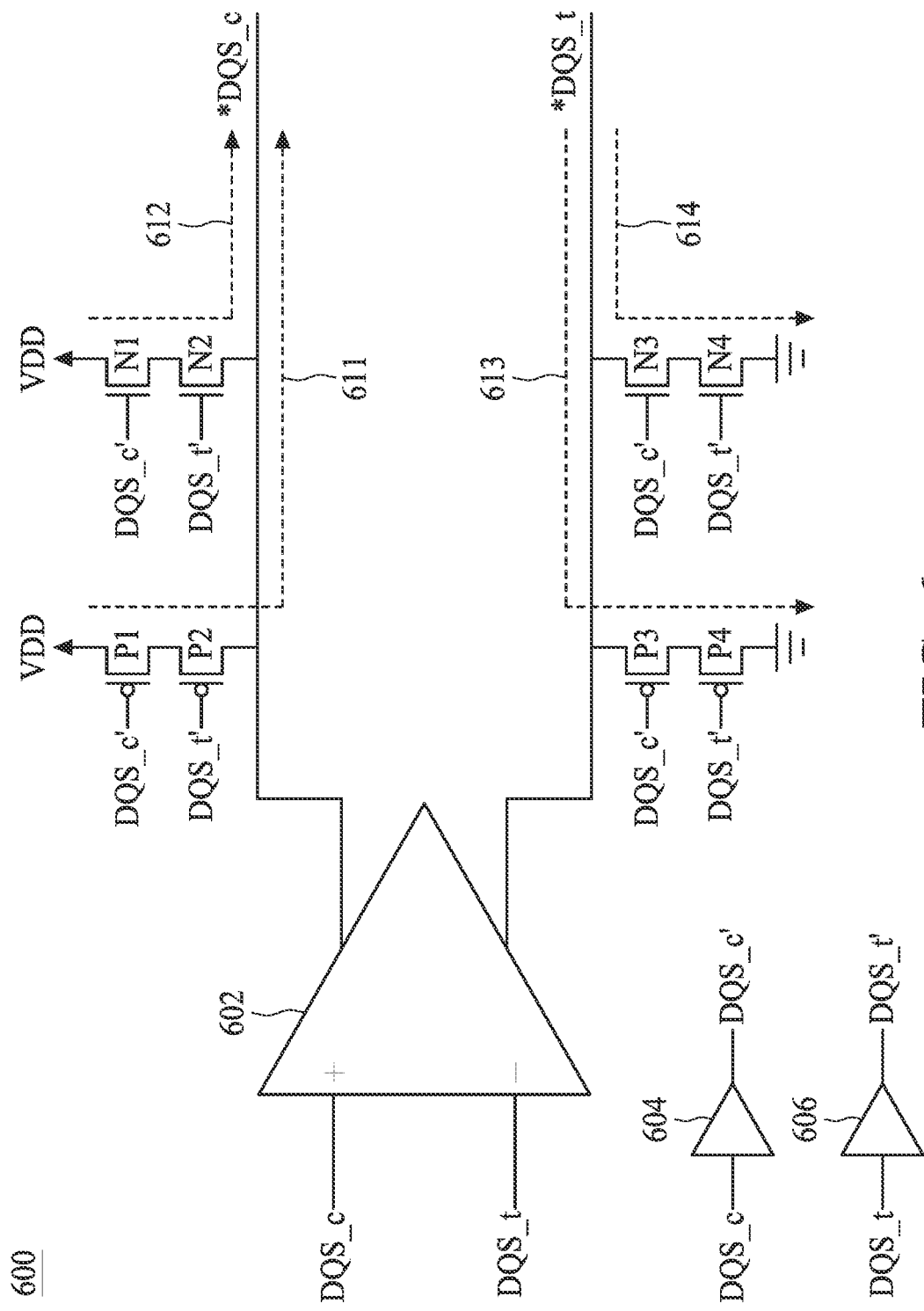
FIG. 6 is a diagram of a receiver circuit 600 in accordance with yet another embodiment of the present disclosure.

FIG. 6 is a diagram of a receiver circuit 600 in accordance with yet another embodiment of the present disclosure. Please refer to FIG. 1 and FIG. 6.

In some embodiments, the receiver circuit 1211 shown in FIG. 1 can be implemented using the receiver circuit 600 shown in FIG. 6. The receiver circuit 600 may include a differential amplifier 602, amplifiers 604 and 606, and transistors P1-P4 and N1-N4. The differential amplifier 602 may be configured to amplify the data strobe signals DQS_c and DQS_t (e.g., input data strobe signals) to generate the data strobe signal *DQS_c and *DQS_t (e.g., output data strobe signals). The amplifier 604 may be configured to amplify the data strobe signal DQS_c to generate an amplified data strobe signal DQS_c'. The amplifier 606 may be configured to amplify the data strobe signal DQS_t to generate an amplified data strobe signal DQS_t'.

In some embodiments, the memory device 120 may be operated using a power supply voltage of 0.6V or 1.1V. However, the amplitude of the data strobe signals DQS_c and DQS_t from the memory controller 110 is between 50 mv and 100 mv, the voltage level of which is insufficient for the control circuit 122 to perform a write or read operation on the memory device 120. In addition, the amplitude of the data strobe signals DQS_c and DQS_t is insufficient to turn on the transistors P1-P4 and N1-N4 since the threshold voltage of the transistors P1-P4 and N1-N4 may be between 0.5V and 0.7V. The amplitude of the amplified data strobe signals DQS_c' and DQS_t' generated by the amplifiers 604 and 606 may be between 0.6V and 1.1V, the voltage level of which is sufficient for the control circuit 122 to perform a write or read operation on the memory device 120.

In some embodiments, the logic state of the data strobe signal *DQS_c may be controlled by voltage pull-up paths 611 and 612. In addition, the logic state of the data strobe signal *DQS_t may be controlled by voltage pull-down paths 613 and 614, as depicted in FIG. 6. In some embodiments, transistors P1 and P2 can be regarded as pull-up transistors, and may form the voltage pull-up path 611. Transistors N1 and N2 can be regarded as pull-up transistors, and may form the voltage pull-up path 612. Transistors P3 and P4 can be regarded as pull-down transistors, and may form the voltage pull-down path 613. Transistors N3 and N4 can be regarded as pull-down transistors, and may form the voltage pull-down path 614.

More specifically, the logic states of the data strobe signals *DQS_c and *DQS_t will follow those of the data strobe signal DQS_c and DQS_t without the voltage pull-up paths 611-612 and voltage pull-down paths 613-614, the details of which are provided in the embodiment of FIG. 2. In some embodiments, when the WDQS function of the memory controller 110 is not enabled or improperly implemented, prior to the write preamble being received by the control circuit 122, the voltage pull-up paths 611 and 612 may be used to correct an inappropriate logic state of the data strobe signal *DQS_c, and the voltage pull-down paths 613 and 614 may be used to correct an inappropriate logic state of the data strobe signal *DQS_t.

In some embodiments, the operation of the receiver circuit 600 may differ when the logic states of the data strobe signals DQS_c and DQS_t are in different conditions. For example, four conditions represent different combinations of the logic states of the data strobe signals DQS_c and DQS_t. In the first condition, both the data strobe signals DQS_c and DQS_t are in the low logic state (i.e., DQS_c=DQS_t=0). In the second condition, both the data strobe signals DQS_c and DQS_t are in the high logic state (i.e., DQS_c=DQS_t=1). In the third condition, the data strobe signal DQS_c is in the low logic state, and the data strobe DQS_t is in the high logic state (i.e., DQS_c=0 and DQS_t=1). In the fourth condition, the data strobe signal DQS_c is in the high logic state, and the data strobe DQS_t is in the low logic state (i.e., DQS_c=1 and DQS_t=0). It should be noted that the logic states of the amplified data strobe signals DQS_c' and DQS_t' follow those of the data strobe signals DQS_c and DQS_t, respectively. For brevity, the logic states of the amplified data strobe signals DQS_c' and DQS_t' are expressed by those of the data strobe signals DQS_t and DQS_t.

In some embodiments, when the logic states of the data strobe signals DQS_c and DQS_t satisfy the first condition for two clock cycles (i.e., DQS_c=DQS_t=0 from time t(n−4) to time t0, as shown in FIG. 3B) prior to the write preamble being received by the control circuit 122, transistors P1 to P4 are turned on, and transistors N1 to N4 are turned off. At this time, the voltage pull-up path 611 is enabled, and the voltage pull-up path 612 is disabled. In addition, the voltage pull-down path 613 is enabled, and the voltage pull-down path 614 is disabled. Thus, the voltage level of the data strobe signal *DQS_c will be pulled up to the power supply voltage VDD through the voltage pull-up path 611, and thus the data strobe signal *DQS_c will be in the high logic state (i.e., *DQS_c=1). In addition, the voltage level of data strobe signal *DQS_t will be pulled down to the ground (e.g., 0V) through the voltage pull-down path 613, and thus the data strobe signal *DQS_t will be in the low logic state.

Specifically, since the logic states of the data strobe signals DQS_c and DQS_t (e.g., DQS_c=DQS_t=0) fail to comply with the requirement for logic states (e.g., DQS_c=1 and DQS_t=0) for two clock cycles prior to the write preamble being received by the control circuit 122 as defined by the LPDDR4 standard, the logic states of the data strobe signals *DQS_c and *DQS_t output by the receiver circuit 600 may be corrected (i.e., *DQS_c=1 and *DQS_t=0) to comply with the requirement for logic states of the data strobe signals as defined by the LPDDR4 standard. Therefore, when the logic states of the data strobe signals DQS_c and DQS_t satisfy a first condition (e.g., DQS_c=DQS_t=0), the WDQS function can be forced on by the receiver circuit 600 so that the corrected logic states of the data strobed signals *DQS_c and *DQS_t comply with the requirement for logic states of the data strobe signals as defined by the LPDDR4 standard. The waveforms of the data strobe signals *DQS_c and *DQS_t with corrected logic states are shown in FIG. 5A, the details of which are provided in the embodiments of FIG. 4.

In some embodiments, when the logic states of the data strobe signals DQS_c and DQS_t satisfy the second condition for two clock cycles (i.e., DQS_c=DQS_t=1 from time t(n−4) to time t0, as shown in FIG. 3C) prior to the write preamble being received by the control circuit 122, transistors P1 to P4 are turned off, and transistors N1 to N4 are turned on. At this time, the voltage pull-up path 611 is disabled, and the voltage pull-up path 612 is enabled. In addition, the voltage pull-down path 613 is disabled, and the voltage pull-down path 614 is enabled. Thus, the voltage level of the data strobe signal *DQS_c will be pulled up to the power supply voltage VDD through the voltage pull-up path 612, and thus the data strobe signal *DQS_c will be in the high logic state (i.e., *DQS_c=1). In addition, the voltage level of data strobe signal *DQS_t will be pulled down to the ground (e.g., 0V) through the voltage pull-down path 614, and thus the data strobe signal *DQS_t will be in the low logic state.

Specifically, since the logic states of the data strobe signals DQS_c and DQS_t (e.g., DQS_c=DQS_t=1) fail to comply with the requirement for logic states (e.g., DQS_c=1 and DQS_t=0) for two clock cycles prior to the write preamble being received by the control circuit 122 as defined by the LPDDR4 standard, the logic states of the data strobe signals *DQS_c and *DQS_t output by the receiver circuit 600 may be corrected (i.e., *DQS_c=1 and *DQS_t=0) to comply with the requirement for logic states of the data strobe signals as defined by the LPDDR4 standard, and the waveforms of the data strobe signals *DQS_c and *DQS_t are shown in FIG. 5A.

In some embodiments, when the logic states of the data strobe signals DQS_c and DQS_t satisfy the third condition for two clock cycles (i.e., DQS_c=1 and DQS_t=0 from time t(n−4) to time t0, as shown in FIG. 3D) prior to the write preamble being received by the control circuit 122, transistors P1, P3, N2, and N4 are turned off, and transistors P2, P4, N1, and N3 are turned on. At this time, the voltage pull-up paths 611 and 612 are disabled, and the voltage pull-down paths 613 and 614 are also disabled. Thus, the receiver circuit 600 will not change the logic states of the data strobe signals *DQS_c and *DQS_t which follow those of the data strobe signals DQS_c and DQS_t.

Specifically, since the logic states of the data strobe signals DQS_c and DQS_t (e.g., DQS_c=1 and DQS_t=0) comply with the requirement for logic states (e.g., DQS_c=1 and DQS_t=0) for two clock cycles prior to the write preamble being received by the control circuit 122 as defined by the LPDDR4 standard, the logic states of the data strobe signals *DQS_c and *DQS_t output by the receiver circuit 600 will follow the logic states of the data strobe signals DQS_c and DQS_t, and the waveforms of the data strobe signals *DQS_c and *DQS_t are shown in FIG. 5A.

In some embodiments, when the logic states of the data strobe signals DQS_c and DQS_t satisfy the fourth condition for two clock cycles (i.e., DQS_c=0 and DQS_t=1 from time t(n−4) to time t0, as shown in FIG. 3E) prior to the write preamble being received by the control circuit 122, transistors P1, P3, N2, and N4 are turned on, and transistors P2, P4, N1, and N3 are turned off. At this time, the voltage pull-up paths 611 and 612 are disabled, as are the voltage pull-down paths 613 and 614. Thus, the receiver circuit 600 will not change the logic states of the data strobe signals *DQS_c and *DQS_t which follow the logic states of the data strobe signals DQS_c and DQS_t.

Specifically, since the logic states of the data strobe signals DQS_c and DQS_t are complementary in the fourth condition, the control circuit 122 may be capable of performing a write operation according to the data strobe signals DQS_c and DQS_t. In addition, the logic states of the data strobe signals *DQS_c and *DQS_t output by the receiver circuit 600 will follow the logic states of the data strobe signals DQS_c and DQS_t. The waveforms of the data strobe signals *DQS_c and *DQS_t with corrected logic states are shown in FIG. 5B, the details of which are provided in the embodiment of FIG. 4.

Figure 7:
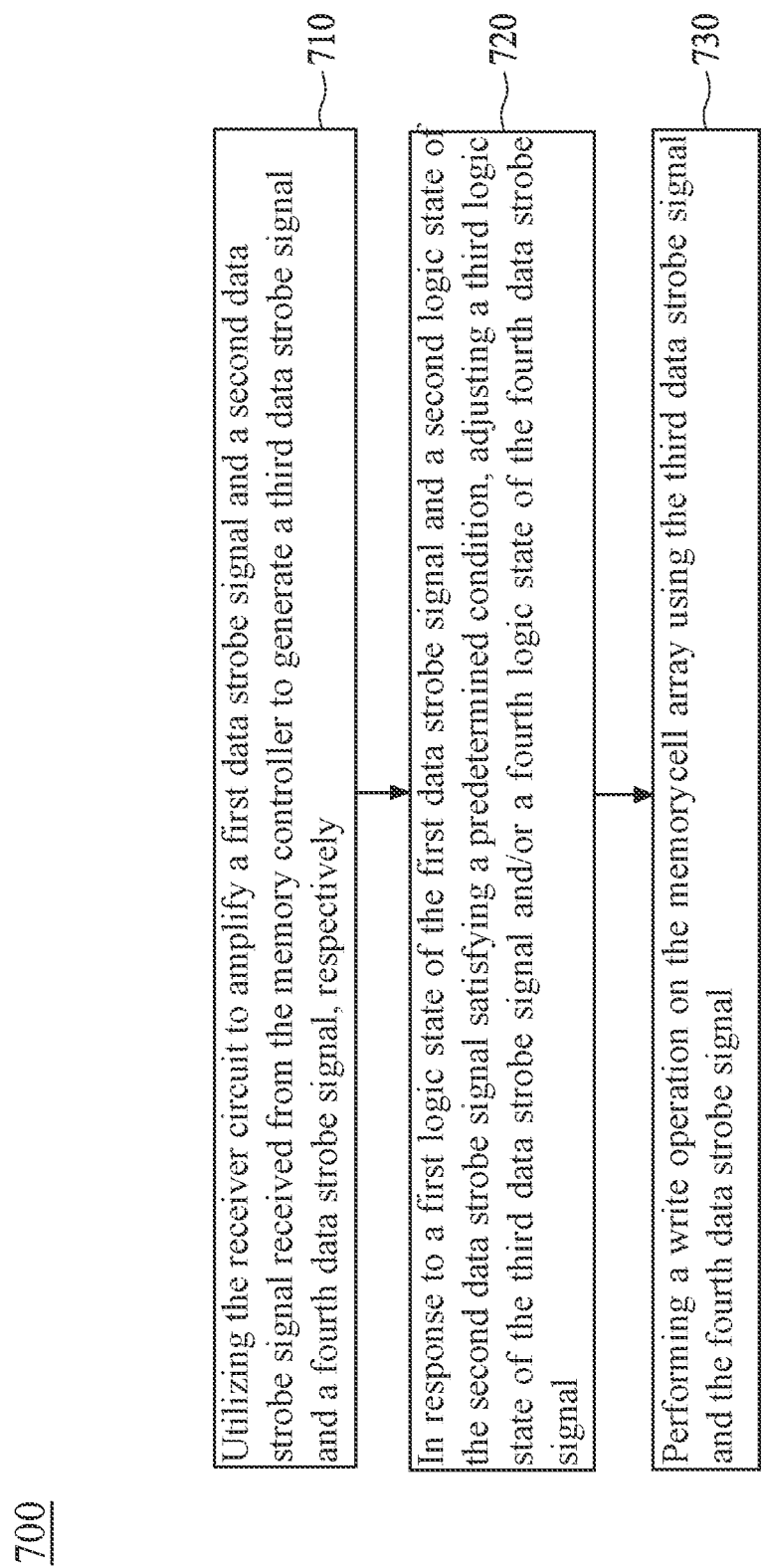
FIG. 7 is a flowchart of a method for adjusting logic states of data strobe signals used by a memory device in accordance with an embodiment of the present disclosure.

FIG. 7 is a flowchart of a method for adjusting logic states of data strobe signals used by a memory device in accordance with an embodiment of the present disclosure. Please refer to FIG. 1, FIG. 4, and FIG. 7.

In step 710, the receiver circuit 400 is utilized to amplify a first data strobe signal (e.g., DQS_c) and a second data strobe signal (e.g., DQS_t) received from the memory controller 110 to generate a third data strobe signal (e.g., *DQS_c) and a fourth data strobe signal (e.g., *DQS_t), respectively. For example, the differential amplifier 402 of the receiver circuit 400 shown in FIG. 4 (or the differential amplifier 602 of the receiver circuit 600 shown in FIG. 6) is configured to amplify the first data strobe signal and the second data strobe signal to generate the third data strobe signal and the fourth data strobe signal. In other words, the amplitude of the third data strobe signal and the fourth data strobe signal is higher than that of the first data strobe signal and the second data strobe signal. In addition, the predetermined condition may refer to the first logic state of the first data strobe signal and the second logic state of the second data strobe signal being in the low logic state, and the first logic state of the first data strobe signal and the second logic state of the second data strobe signal being in the high logic state.

In step 720, in response to a first logic state of the first data strobe signal and a second logic state of the second data strobe signal satisfying a predetermined condition, a third logic state of the third data strobe signal and/or a fourth logic state of the fourth data strobe signal is adjusted by the receiver circuit 1211. For example, the third logic state of the third data strobe signal and/or the fourth logic state of the fourth data strobe signal can be adjusted by the voltage pull-up paths 411-412 and voltage pull-down paths 413-414 shown in FIG. 4 (or by the voltage pull-up paths 611-612 and voltage pull-down paths 613-614 shown in FIG. 6).

In step 730, a write operation is performed by the controller circuit 122 on the memory cell array 123 using the third data strobe signal and the fourth data strobe signal. For example, the third logic state of the data strobe signal and the fourth logic state of the fourth data strobe signal have been adjusted by the receiver circuit 400, so that the third logic state of the data strobe signal and the fourth logic state of the fourth data strobe signal comply with the requirement of logic states as defined in the LPDDR4 standard. Therefore, the control circuit 122 can perform a write operation normally even though the first logic state of the first data strobe signal and the second logic state of the second data strobe signal are not well controlled by the memory controller 110 (e.g., the WDQS function is turned off or not properly implemented) prior to a write preamble being received by the control circuit 122.

One aspect of the present disclosure provides a memory device. The memory device includes a memory cell array, a control circuit, and an interface circuit. The control circuit is configured to control data access of the memory cell array. The interface circuit is configured to receive a write command, a first data strobe signal, and a second data strobe signal from a memory controller. The interface circuit includes a receiver circuit configured to amplify the first data strobe signal and the second data strobe signal to generate a third data strobe signal and a fourth data strobe signal. In response to a first logic state of the first data strobe signal and a second logic state the second data strobe signal satisfying a predetermined condition, the receiver circuit is further configured to adjust a third logic state of the third data strobe signal and/or a fourth logic state of the fourth data strobe signal. The control circuit is further configured to perform a write operation on the memory cell array according to the write command, the third data strobe signal, and the fourth data strobe signal.

In some embodiments, the third logic state of the third data strobe signal is complementary to the fourth logic state of the fourth data strobe signal.

In some embodiments, the receiver circuit comprises a differential amplifier configured to amplify the first data strobe signal and the second data strobe signal to generate the third data strobe signal and the fourth data strobe signal.

In some embodiments, the third logic state of the third data strobe signal is controlled by a first voltage pull-up path and a second voltage pull-up path of the receiver circuit, and the fourth logic state of the fourth data strobe signal is controlled by a first voltage pull-down path and a second voltage pull-down path of the receiver circuit.

In some embodiments, the first voltage pull-up path, the second voltage pull-up path, the first voltage pull-down path, and the second voltage pull-down path are controlled by the first data strobe signal and the second data strobe signal.

In some embodiments, the first voltage pull-up path comprises a first first-type transistor and a second first-type transistor coupled between a power supply voltage and the third data strobe signal, and the second voltage pull-up path comprises a first second-type transistor and a second second-type transistor coupled between the power supply voltage and the third data strobe signal.

In some embodiments, the first voltage pull-down path comprises a third first-type transistor and a fourth first-type transistor coupled between a ground and the fourth data strobe signal, and the second voltage pull-down path comprises a third second-type transistor and a fourth second-type transistor coupled between the ground and the fourth data strobe signal.

In some embodiments, the predetermined condition indicates that the first logic state of the first data strobe signal and the second logic state the second data strobe signal are in a low logic state for a duration prior to a write preamble being received by the control circuit.

In some embodiments, in the duration prior to the write preamble being received by the control circuit, the third logic state of the third data strobe signal is pulled up to a high logic state through the first voltage pull-up path, and the fourth logic state of the fourth data strobe signal is pulled down to the low logic state through the first voltage pull-down path.

In some embodiments, the predetermined condition indicates that the first logic state of the first data strobe signal and the second logic state the second data strobe signal are in a high logic state for a duration of two clock cycles prior to a write preamble being received by the control circuit.

In some embodiments, in the duration prior to the write preamble being received by the control circuit, the third logic state of the third data strobe signal is pulled up to the high logic state through the second voltage pull-up path, and the fourth logic state of the fourth data strobe signal is pulled down to a low logic state through the second voltage pull-down path.

In some embodiments, when the first logic state of the first data strobe signal is in a high logic state and the second logic state of the second data strobe signal is in a low logic state, the third logic state of the third data strobe signal and the fourth logic state of the fourth data strobe signal follow the first logic state of the first data strobe signal and the second logic state of the second data strobe signal, respectively.

In some embodiments, when the first logic state of the first data strobe signal is in a low logic state and the second logic state of the second data strobe signal is in a high logic state, the third logic state of the third data strobe signal and the fourth logic state of the fourth data strobe signal follow the first logic state of the first data strobe signal and the second logic state of the second data strobe signal, respectively.

Another aspect of the present disclosure provides a memory device. The memory device includes a memory cell array, a control circuit, and an interface circuit. The control circuit is configured to control data access of the memory cell array. The interface circuit is configured to receive a write command, a first data strobe signal, and a second data strobe signal from a memory controller. The interface circuit includes a receiver circuit configured to amplify the first data strobe signal and the second data strobe signal to generate a third data strobe signal and a fourth data strobe signal. In response to a first logic state of the first data strobe signal and a second logic state the second data strobe signal satisfying a predetermined condition, the receiver circuit is further configured to adjust a third logic state of the third data strobe signal via a first voltage pull-up path and a second voltage pull-up path of the receiver circuit, and to adjust a fourth logic state of the fourth data strobe signal via a first voltage pull-down path and a second voltage pull-down path of the receiver circuit. The control circuit is further configured to perform a write operation on the memory cell array according to the write command, the third data strobe signal, and the fourth data strobe signal.

In some embodiments, the third logic state of the third data strobe signal is complementary to the fourth logic state of the fourth data strobe signal.

In some embodiments, the receiver circuit includes a differential amplifier, a first amplifier, and a second amplifier. The differential amplifier is configured to amplify the first data strobe signal and the second data strobe signal to generate the third data strobe signal and the fourth data strobe signal. The first amplifier is configured to amplify the first data strobe signal to generate a first amplified data strobe signal. The second amplifier is configured to amplify the second data strobe signal to generate a second amplified data strobe signal.

In some embodiments, the first voltage pull-up path comprises a first first-type transistor and a second first-type transistor coupled between a power supply voltage and the third data strobe signal, and the second voltage pull-up path comprises a first second-type transistor and a second second-type transistor coupled between the power supply voltage and the third data strobe signal, and the first second-type transistor. The first first-type transistor and the first second-type transistor are controlled by the first amplified data strobe signal, and the second first-type transistor and the second second-type transistor are controlled by the second amplified data strobe signal.

In some embodiments, the first voltage pull-down path comprises a third first-type transistor and a fourth first-type transistor coupled between a ground and the fourth data strobe signal, and the second voltage pull-down path comprises a third second-type transistor and a fourth second-type transistor coupled between the ground and the fourth data strobe signal. The third first-type transistor and the third second-type transistor are controlled by the first amplified data strobe signal, and the fourth first-type transistor and the fourth second-type transistor are controlled by the second amplified data strobe signal.

In some embodiments, the predetermined condition indicates that the first logic state of the first data strobe signal and the second logic state the second data strobe signal are in a low logic state for a duration prior to a write preamble being received by the control circuit.

In some embodiments, in the duration prior to the write preamble being received by the control circuit, the third logic state of the third data strobe signal is pulled up to a high logic state through the first voltage pull-up path, and the fourth logic state of the fourth data strobe signal is pulled down to the low logic state through the first voltage pull-down path.

In some embodiments, the predetermined condition indicates that the first logic state of the first data strobe signal and the second logic state the second data strobe signal are in a high logic state for a duration prior to a write preamble being received by the control circuit.

In some embodiments, in the duration prior to the write preamble being received by the control circuit, the third logic state of the third data strobe signal is pulled up to the high logic state through the second voltage pull-up path, and the fourth logic state of the fourth data strobe signal is pulled down to a low logic state through the second voltage pull-down path.

In some embodiments, when the first logic state of the first data strobe signal is in a high logic state and the second logic state of the second data strobe signal is in a low logic state, the third logic state of the third data strobe signal and the fourth logic state of the fourth data strobe signal follow the first logic state of the first data strobe signal and the second logic state of the second data strobe signal, respectively.

In some embodiments, when the first logic state of the first data strobe signal is in a low logic state and the second logic state of the second data strobe signal is in a high logic state, the third logic state of the third data strobe signal and the fourth logic state of the fourth data strobe signal follow the first logic state of the first data strobe signal and the second logic state of the second data strobe signal, respectively.

Yet another aspect of the present disclosure provides a method for adjusting logic states of data strobe signals used by a memory device electrically connected to a memory controller. The memory device includes a receiver circuit, a control circuit, and a memory cell array. The method includes the following steps: utilizing the receiver circuit to amplify a first data strobe signal and a second data strobe signal from the memory controller to generate a third data strobe signal and a fourth data strobe signal, respectively; in response to a first logic state of the first data strobe signal and a second logic state of the second data strobe signal satisfying a predetermined condition, adjusting, by the receiver circuit, a third logic state of the third data strobe signal and/or a fourth logic state of the fourth data strobe signal; and performing a write operation, by the control circuit, to the memory cell array using the third data strobe signal and the fourth data strobe signal.

In some embodiments, the third logic state of the third data strobe signal is complementary to the fourth logic state of the fourth data strobe signal.

In some embodiments, the method further includes the following steps: controlling the third logic state of the third data strobe signal by a first voltage pull-up path and a second voltage pull-up path of the receiver circuit; and controlling the fourth logic state of the fourth data strobe signal by a first voltage pull-down path and a second voltage pull-down path of the receiver circuit.

In some embodiments, the first voltage pull-up path, the second voltage pull-up path, the first voltage pull-down path, and the second voltage pull-down path are controlled by the first data strobe signal and the second data strobe signal.

In some embodiments, the first voltage pull-up path, the second voltage pull-up path, the first voltage pull-down path, and the second voltage pull-down path are controlled by an amplified first data strobe signal and an amplified second data strobe signal.

In some embodiments, the predetermined condition indicates that the first logic state of the first data strobe signal and the second logic state the second data strobe signal are in a low logic state withfor a duration prior to a write preamble being received by the control circuit.

In some embodiments, the predetermined condition indicates that the first logic state of the first data strobe signal and the second logic state the second data strobe signal are in a high logic state for a duration prior to a write preamble being received by the control circuit.

In some embodiments, when the first logic state of the first data strobe signal is complementary to the second logic state of the second data strobe signal, the third logic state of the third data strobe signal and the fourth logic state of the fourth data strobe signal follow the first logic state of the first data strobe signal and the second logic state of the second data strobe signal, respectively.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A memory device, comprising:
   a memory cell array;
   a control circuit, configured to control data access of the memory cell array; and
   an interface circuit, configured to receive a write command, a first data strobe signal, and a second data strobe signal from a memory controller, wherein the interface circuit comprises:
      a receiver circuit, configured to amplify the first data strobe signal and the second data strobe signal to generate a third data strobe signal and a fourth data strobe signal;
   wherein in response to a first logic state of the first data strobe signal and a second logic state the second data strobe signal satisfying a predetermined condition, the receiver circuit is further configured to adjust a third logic state of the third data strobe signal and/or a fourth logic state of the fourth data strobe signal,
   wherein the control circuit is further configured to perform a write operation on the memory cell array according to the write command, the third data strobe signal, and the fourth data strobe signal.

2. The memory device of claim 1, wherein the third logic state of the third data strobe signal is complementary to the fourth logic state of the fourth data strobe signal.

3. The memory device of claim 1, wherein the receiver circuit comprises a differential amplifier configured to amplify the first data strobe signal and the second data strobe signal to generate the third data strobe signal and the fourth data strobe signal.

4. The memory device of claim 2, wherein the third logic state of the third data strobe signal is controlled by a first voltage pull-up path and a second voltage pull-up path of the receiver circuit, and the fourth logic state of the fourth data strobe signal is controlled by a first voltage pull-down path and a second voltage pull-down path of the receiver circuit.

5. The memory device of claim 4, wherein the first voltage pull-up path, the second voltage pull-up path, the first voltage pull-down path, and the second voltage pull-down path are controlled by the first data strobe signal and the second data strobe signal.

6. The memory device of claim 5, wherein the first voltage pull-up path comprises a first first-type transistor and a second first-type transistor coupled between a power supply voltage and the third data strobe signal, and the second voltage pull-up path comprises a first second-type transistor and a second second-type transistor coupled between the power supply voltage and the third data strobe signal.

7. The memory device of claim 6, wherein the first voltage pull-down path comprises a third first-type transistor and a fourth first-type transistor coupled between a ground and the fourth data strobe signal, and the second voltage pull-down path comprises a third second-type transistor and a fourth second-type transistor coupled between the ground and the fourth data strobe signal.

8. The memory device of claim 7, wherein the predetermined condition indicates that the first logic state of the first data strobe signal and the second logic state the second data strobe signal are in a low logic state for a duration prior to a write preamble being received by the control circuit.

9. The memory device of claim 8, wherein, in the duration prior to the write preamble being received by the control circuit, the third logic state of the third data strobe signal is pulled up to a high logic state through the first voltage pull-up path, and the fourth logic state of the fourth data strobe signal is pulled down to the low logic state through the first voltage pull-down path.

10. The memory device of claim 7, wherein the predetermined condition indicates that the first logic state of the first data strobe signal and the second logic state the second data strobe signal are in a high logic state for a duration of two clock cycles prior to a write preamble being received by the control circuit.

11. The memory device of claim 10, wherein, in the duration prior to the write preamble being received by the control circuit, the third logic state of the third data strobe signal is pulled up to the high logic state through the second voltage pull-up path, and the fourth logic state of the fourth data strobe signal is pulled down to a low logic state through the second voltage pull-down path.

12. The memory device of claim 1, wherein when the first logic state of the first data strobe signal is in a high logic state and the second logic state of the second data strobe signal is in a low logic state, the third logic state of the third data strobe signal and the fourth logic state of the fourth data strobe signal follow the first logic state of the first data strobe signal and the second logic state of the second data strobe signal, respectively.

13. The memory device of claim 1, wherein when the first logic state of the first data strobe signal is in a low logic state and the second logic state of the second data strobe signal is in a high logic state, the third logic state of the third data strobe signal and the fourth logic state of the fourth data strobe signal follow the first logic state of the first data strobe signal and the second logic state of the second data strobe signal, respectively.

14. A memory device, comprising:
    a memory cell array;
    a control circuit, configured to control data access of the memory cell array; and
    an interface circuit, configured to receive a write command, a first data strobe signal, and a second data strobe signal from a memory controller, wherein the interface circuit comprises:
       a receiver circuit, configured to amplify the first data strobe signal and the second data strobe signal to generate a third data strobe signal and a fourth data strobe signal;
    wherein in response to a first logic state of the first data strobe signal and a second logic state the second data strobe signal satisfying a predetermined condition, the receiver circuit is further configured to adjust a third logic state of the third data strobe signal via a first voltage pull-up path and a second voltage pull-up path of the receiver circuit, and to adjust a fourth logic state of the fourth data strobe signal via a first voltage pull-down path and a second voltage pull-down path of the receiver circuit, wherein the control circuit is further configured to perform a write operation on the memory cell array according to the write command, the third data strobe signal, and the fourth data strobe signal.

15. The memory device of claim 14, wherein the third logic state of the third data strobe signal is complementary to the fourth logic state of the fourth data strobe signal.

16. The memory device of claim 14, wherein the receiver circuit comprises:
- a differential amplifier configured to amplify the first data strobe signal and the second data strobe signal to generate the third data strobe signal and the fourth data strobe signal;
- a first amplifier, configured to amplify the first data strobe signal to generate a first amplified data strobe signal; and
- a second amplifier, configured to amplify the second data strobe signal to generate a second amplified data strobe signal.

17. The memory device of claim 16, wherein the first voltage pull-up path comprises a first first-type transistor and a second first-type transistor coupled between a power supply voltage and the third data strobe signal, and the second voltage pull-up path comprises a first second-type transistor and a second second-type transistor coupled between the power supply voltage and the third data strobe signal, and the first second-type transistor,
wherein the first first-type transistor and the first second-type transistor are controlled by the first amplified data strobe signal, and the second first-type transistor and the second second-type transistor are controlled by the second amplified data strobe signal.

18. The memory device of claim 17, wherein the first voltage pull-down path comprises a third first-type transistor and a fourth first-type transistor coupled between a ground and the fourth data strobe signal, and the second voltage pull-down path comprises a third second-type transistor and a fourth second-type transistor coupled between the ground and the fourth data strobe signal,
wherein the third first-type transistor and the third second-type transistor are controlled by the first amplified data strobe signal, and the fourth first-type transistor and the fourth second-type transistor are controlled by the second amplified data strobe signal.

19. The memory device of claim 18, wherein the predetermined condition indicates that the first logic state of the first data strobe signal and the second logic state the second data strobe signal are in a low logic state for a duration prior to a write preamble being received by the control circuit.

20. The memory device of claim 19, wherein in the duration prior to the write preamble being received by the control circuit, the third logic state of the third data strobe signal is pulled up to a high logic state through the first voltage pull-up path, and the fourth logic state of the fourth data strobe signal is pulled down to the low logic state through the first voltage pull-down path.

* * * * *